(12) United States Patent
Rowhani et al.

(10) Patent No.: US 9,837,398 B1
(45) Date of Patent: Dec. 5, 2017

(54) METAL TRACK CUTTING IN STANDARD CELL LAYOUTS

(71) Applicants:Advanced Micro Devices, Inc., Sunnyvale, CA (US); ATI Technologies ULC, Markham (CA)

(72) Inventors: Omid Rowhani, Kettleby (CA); Jason P. Cain, Austin, TX (US); Ioan Cordos, Thornhill (CA); Michael Davinson Sherriff, Mississauga (CA); Hoang Q. Dao, Austin, TX (US)

(73) Assignees: Advanced Micro Devices, Inc., Sunnyvale, CA (US); ATI Technologies ULC, Markham (CA)

( * ) Notice: Subject to any disclaimer, the term of this patent is extended or adjusted under 35 U.S.C. 154(b) by 0 days.

(21) Appl. No.: 15/360,168

(22) Filed: Nov. 23, 2016

(51) Int. Cl.
| | | |
|---|---|---|
| *H01L 27/118* | (2006.01) | |
| *H01L 27/02* | (2006.01) | |
| *H01L 29/06* | (2006.01) | |
| *H01L 23/528* | (2006.01) | |
| *G06F 17/50* | (2006.01) | |

(52) U.S. Cl.
CPC ...... *H01L 27/0207* (2013.01); *G06F 17/5072* (2013.01); *G06F 17/5077* (2013.01); *H01L 23/528* (2013.01); *H01L 29/0696* (2013.01)

(58) Field of Classification Search
CPC ..... H01L 27/11807; H01L 2027/11812; H01L 2027/11875
USPC ................................................. 257/208, 210
See application file for complete search history.

(56) References Cited

U.S. PATENT DOCUMENTS

| | | | | |
|---|---|---|---|---|
| 4,851,892 | A * | 7/1989 | Anderson | H01L 27/11807 257/206 |
| 6,242,767 | B1 * | 6/2001 | How | H01L 27/0207 257/202 |
| 8,264,007 | B2 * | 9/2012 | Becker | H01L 27/0207 257/206 |
| 8,356,268 | B2 * | 1/2013 | Becker | G06F 17/5068 257/211 |
| 2015/0048425 | A1 * | 2/2015 | Park | H01L 27/0207 257/211 |

* cited by examiner

*Primary Examiner* — S. V. Clark
(74) *Attorney, Agent, or Firm* — Rory D. Rankin; Meyertons, Hood, Kivlin, Kowert & Goetzel, P.C.

(57) ABSTRACT

Integrated circuit layouts are disclosed that include metal layers with metal tracks having separate metal sections along the metal tracks. The separate metal sections along a single track may be electrically isolated from each other. The separate metal sections may then be electrically connected to different voltage tracks in metal layers above and/or below the metal layer with the separate metal sections. One or more of the metal layers in the integrated circuit layouts may also include metal tracks at different voltages (e.g., power and ground) that are adjacent to each other within a power grid layout. The metal tracks may be separated by electrically insulating material. The metal tracks and the electrically insulating material between the tracks may create capacitance in the power grid layout.

20 Claims, 5 Drawing Sheets

METAL TRACK CUTTING IN STANDARD CELL LAYOUTS

BACKGROUND

Description of the Related Art

As the size of the individual transistors has steadily decreased through advances in process development and the need to increase feature density. Current scaling is progressing towards 7 nm and beyond technologies with electromigration and IR (voltage) drop becoming more concerning as scaling progresses downward. These technologies are continuously challenged on logic scaling versus cost. Attempts to improve routing congestion and cell placement may be able to make a difference on whether a selected technology may be cost effectively implemented or not.

Current cell technologies may include standard cells that have metal layers with unidirectional metal features (e.g., metal tracks or metal rails). Integrated circuit layouts are often now generated with these unidirectional metal features spanning the width of the standard cell (e.g., the metal tracks extend the width of the standard cell) in the metal layer to create a generic layout of metal features. Previous technologies typically put metal features only where they were needed. Using metal layers with unidirectional metal features spanning the width of the standard cell, however, provides the generic layout that may be used as a generic starting point for multiple different technologies or processes. The generic layout of the metal layer may then be defined separately for each individual technology or process used to generate an integrated circuit.

The metal layer may define operational sections of the metal features (e.g., the metal tracks). Operational sections may be, for example, active sections of the metal features that contribute to the operation or functionality of the integrated circuit (e.g., internal nets, signal lines, routing lines, and/or power rails). Using the generic layout, however, sections of the metal features that do not contribute to the functionality of the integrated circuit (e.g., are not active in operation of the integrated circuit) may remain after the operational sections of the metal features are defined. While these "remnant" sections may not contribute to the operation or functionality of integrated circuit, they may, however, affect the performance of the integrated circuit.

For example, all or part of the non-functional remnant section may run next to an operational section in an adjacent metal feature. Because the remnant section is adjacent to an operation section, the remnant section may introduce or increase capacitance in the adjacent operational section via, for example, parasitic capacitance coupling between the sections. The increased capacitance in the operational section may reduce the performance of the integrated circuit. Thus, there is a need to reduce the capacitance induced by capacitance coupling with these remnant sections to improve the operational performance of the integrated circuit.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

DETAILED DESCRIPTION OF THE EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Figure 1:
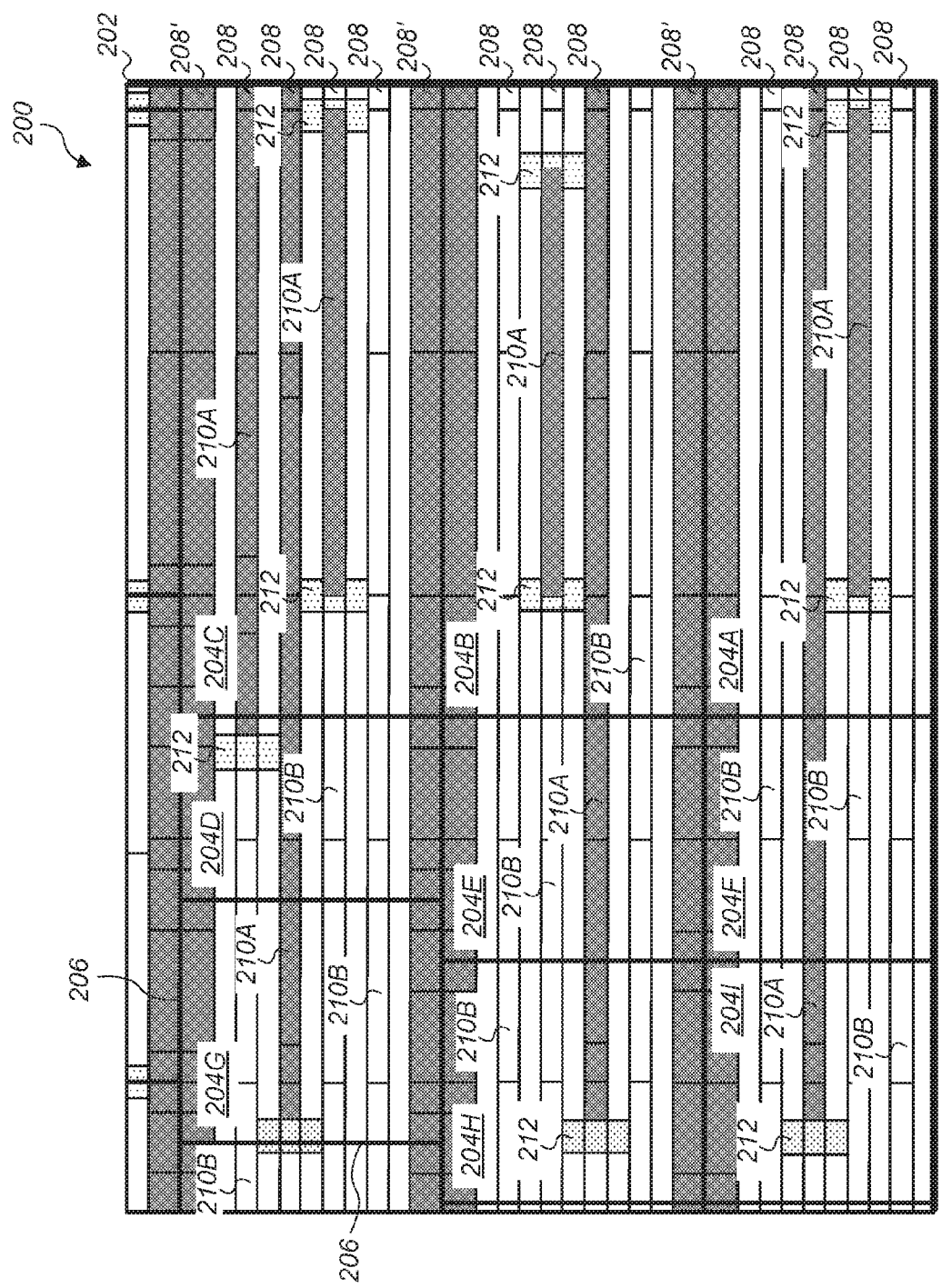
FIG. 1 depicts a top view representation of an embodiment of a metal layer in an integrated circuit layout.

FIG. 1 depicts a top view representation of an embodiment of a metal layer in an integrated circuit layout. In certain embodiments, integrated circuit layout 200 includes metal layer 202 placed in the layout. Metal layer 202 may be divided into a plurality of cells 204A-204H by cell boundary 206. In some embodiments, cells 204A-204H are standard cells in layout 200. While cells 204A-204H are depicted in FIG. 1 with particular sizes/shapes shown, it is to be understood that the number of cells 204 and/or the size/shape of the cells may vary in layout 200.

In certain embodiments, metal layer 202 includes a plurality of substantially parallel metal tracks 208. Tracks 208 may be metal features such as metal rails. As shown in FIG. 1, tracks 208 are horizontal tracks, it is to be understood, however, that the horizontal tracks are representative of one embodiment of a metal layer and that metal layers in layout 200 may have different orientations (e.g., tracks 208 may be vertical in the metal layer).

In certain embodiments, layout 200 is a generic layout using tracks 208. The generic layout provided by tracks 208 may be used as a generic starting point for a selected integrated circuit layout to be defined by further processing layers. In certain embodiments, the generic layout includes metal layer 202 with tracks 208 that extend the width of cells 204 (e.g., the tracks extend from one side of the cell to the other side of the cell). Thus, cells 204, as defined by cell boundary 206, include unidirectional tracks 208 that span the width of the cells.

Cells 204, as defined by cell boundary 206, have a plurality of tracks 208 within each cell. In certain embodiments, tracks 208 are defined into active sections 210A and inactive sections 210B in layout 200. Active sections 210A may be operational or functional sections of layout 200 that contribute to the operation or function of the integrated circuit. Inactive sections 210B may be sections of layout 200 that do not contribute to the operation or function of the integrated circuit (e.g., non-operational or non-functional sections). In some embodiments, tracks along the horizontal cell boundary 206 are active sections 210A substantially along their entire length. For example, tracks 208' may be used as power rails at boundary 206 between cells.

In certain embodiments, tracks 208 are defined into active sections 210A and inactive sections 210B using cuts 212 in layout 200. Cuts 212 may be, for example, cut lines on tracks 208 defined for one or more masks used in forming the integrated circuit of layout 200. As shown in FIG. 1, cuts 212 define the transitions between active sections 210A and inactive sections 210B. Thus, cuts 212 may define the ends of active sections 210A and inactive sections 210B.

As described herein, while inactive sections 210B do not contribute to the functionality or operation of the integrated circuit of layout 200, the inactive sections may contribute capacitance to the integrated circuit and reduce performance of the integrated circuit. For example, inactive sections 210B that are adjacent to power rails can add additional capacitance to the power rails (e.g., tracks 208'). The longer the length of an inactive section 210B, the greater the capacitance contribution by the inactive section. Thus, capacitance contribution of inactive sections 210B may be reduced by reducing the functional length of the inactive sections (e.g., electrically isolating portions of the inactive sections to effectively reduce the length of a capacitive plate).

Figure 2:
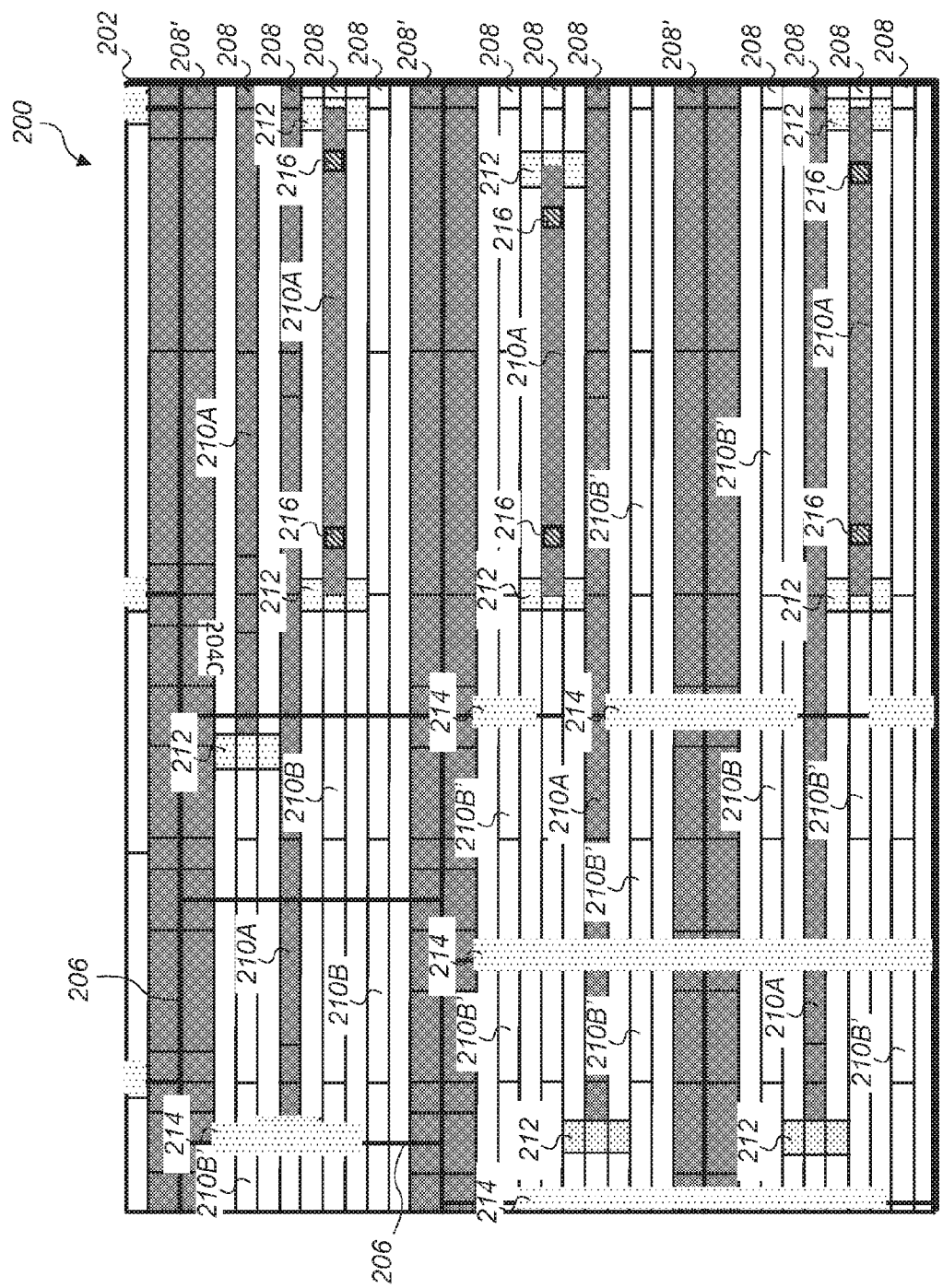
FIG. 2 depicts a top view representation of an embodiment of a metal layer in an integrated circuit layout with additional cuts.

In certain embodiments, one or more additional cuts are provided in layout 200 to electrically isolate portions of inactive sections 210B. FIG. 2 depicts a top view representation of an embodiment of metal layer 202 in integrated circuit layout 200 with additional cuts 214. In some embodiments, cuts 214 are cut lines on tracks 208 defined by one or more additional masks used in forming the integrated circuit of layout 200. Cuts 214 are used mark placements of cuts (e.g., breaks) in inactive sections 210B that will electrically isolate portions 210B' from each other. Electrically isolating portions 210B' inside inactive sections 210B reduces capacitance in layout 200 and improves the performance of the integrated circuit of the layout.

In some embodiments, placement of cuts 214 is controlled by design rules associated with layout 200. For example, a place-and-route tool may follow design rules that allow cuts 214 to only be placed in inactive sections 210B (e.g., along portions of tracks 208 that are not in active sections 210A). In some embodiments, as shown in FIG. 2, cuts 214 are placed along cell boundary 206. Design rules may, however, only allow cuts 214 to be placed along cell boundary 206 where active sections 210A (e.g., signal or power lines) do not intersect the cell boundary. While cuts 214 are shown to be on cell boundary 206 in FIG. 2, cuts 214 may be placed at other locations in metal layer 202 that are not along the cell boundary as desired or allowed by design rules for layout 200.

In some embodiments, inactive sections 210B are cut into two portions 210B'. In some embodiments, inactive sections 210B are cut into more than two portions 210B'. The number and size of portions 210B' may be controlled by design rules for layout 200 and/or a desired optimization of performance in the integrated circuit of the layout.

In certain embodiments, one or more additional cuts are provided inside active sections 210A to reduce electrical effects of inactive portions inside the active sections. As shown in FIG. 2, some embodiments of active sections 210A include via connections 216. Via connections 216 are vias or other electrical connections through an insulating layer between metal layer 202 and a layer above the metal layer or a layer below the metal layer. An example of a layer above the metal layer is another metal layer in layout 200. An example of a layer below the metal layer is another metal layer or a device layer. In some embodiments, the portion of active section 210 between via connections 216 is an internal net in layout 200.

Figure 3:
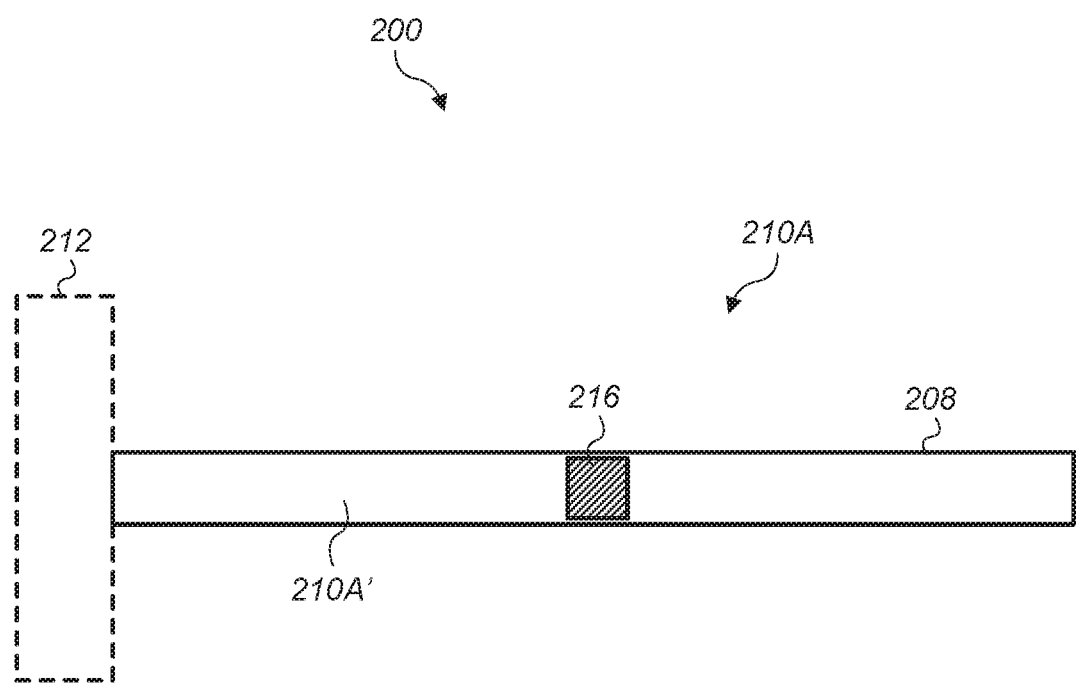
FIG. 3 depicts an enlarged top view representation of an embodiment of a portion of an active section in an integrated circuit layout with a via connection near a cut.

FIG. 3 depicts an enlarged top view representation of an embodiment of a portion of active section 210A in integrated circuit layout 200 with via connection 216 near cut 212. In certain embodiments, portion 210A' of active section 210A between via connection 216 and cut 212 is an "inactive portion" (e.g., inactive section) of the active section. Thus, portion 210A' is similar to inactive sections 210B (shown in FIGS. 1 and 2). In such embodiments, portion 210A' is an inactive section that does not contribute to the functionality or operation of active section 210A and/or the integrated circuit of layout 200. If portion 210A' is adjacent to an active portion of a metal track, portion 210A' may contribute to increased parasitic capacitance between portion 210A' and the active portion of the adjacent metal track.

Figure 4:
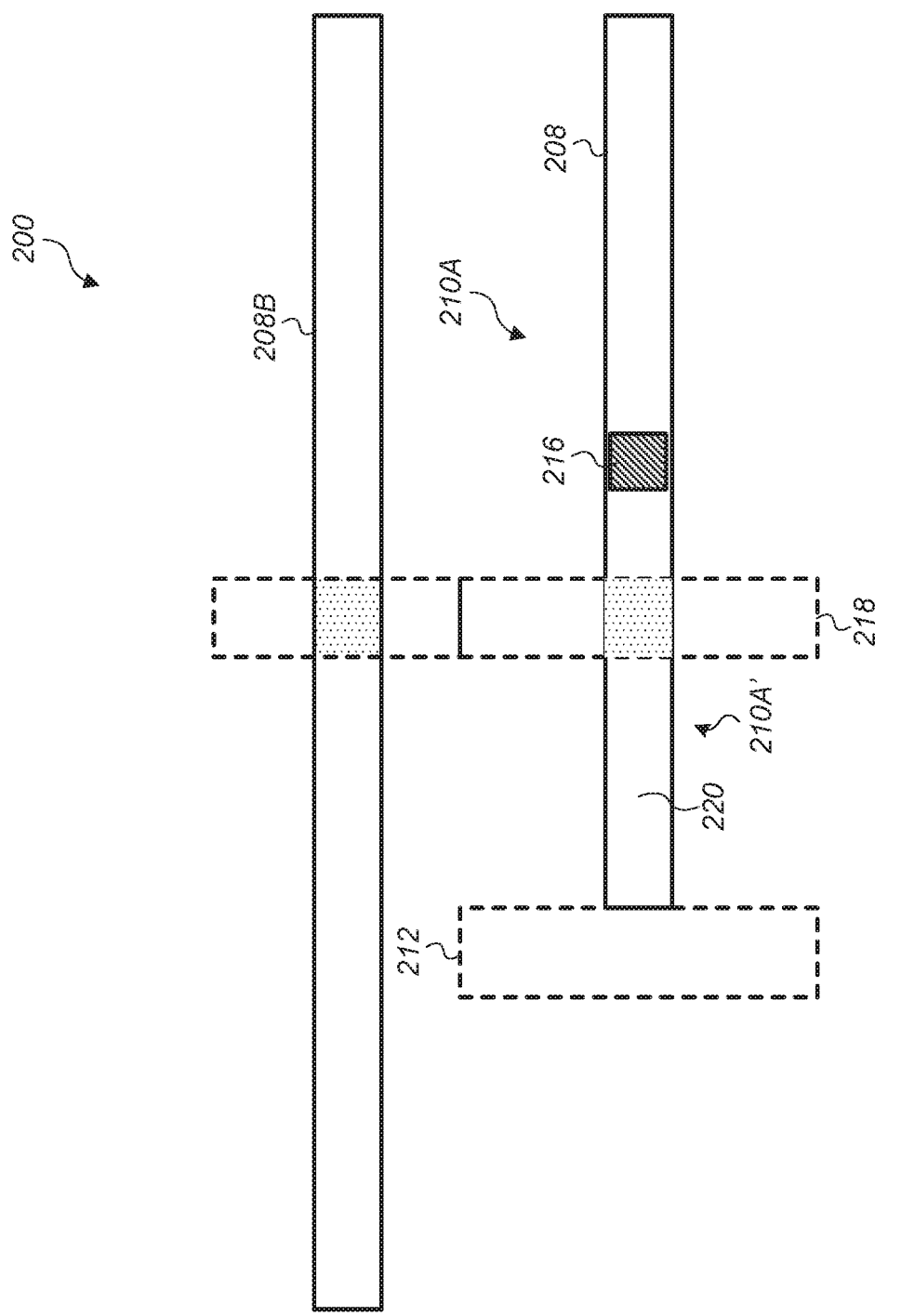
FIG. 4 depicts an enlarged top view representation of an embodiment of a portion of an active section with an additional cut.

FIG. 4 depicts an enlarged top view representation of an embodiment of a portion of active section 210A with additional cut 218. In certain embodiments, cut 218 is placed between via connection 216 and cut 212 in inactive portion 210A'. Cut 218 may form portion 220 between via connection 216 and cut 212. Cut 218 is used to mark placement of a cut (e.g., a break) that electrically isolates portion 220 from via connection 216 and the active portion of active section 210A (e.g., the portion or internal net between via connections). Thus, portion 220 may be a "floating" portion in active section 210A.

Electrically isolating portion 220 from via connection 216 and the active portion of active section 210A may reduce capacitance between active section 210A and an active section on an adjacent metal track (e.g., track 208B, shown in FIG. 4). Reducing the capacitance in active section 210A by electrically isolating portion 220 with cut 218 may improve the performance of the integrated circuit of layout 200.

Cut 218 may be a cut line on track 208 defined by one or more additional masks used in forming the integrated circuit of layout 200. In some embodiments, cut 218 is used in combination with cuts 214 (shown in FIG. 2). Cut 218 may be defined on the same mask as cuts 214 or cut 218 may be defined on a different mask from cuts 214. In some embodiments, cut 218 is used instead of cuts 214 (or vice versa).

In some embodiments, placement of cut 218 is controlled by design rules associated with layout 200. For example, a place-and-route tool may follow design rules that allow cut 218 to only be placed in inactive portions 210A' according to one or more design criteria dependent on layout 200. In some embodiments, as shown in FIG. 4, cut 218 is also used to cut adjacent track 208B if the design rules allow the cuts in the adjacent tracks to be aligned. For example, if there is a cut to be placed in track 208B, cut 218 may be aligned with that cut and the cuts combined into a single cut for more efficient processing of layout 200. In some embodiments, however, design rules for layout 200 may only allow cut 218 to be placed on track 208 when certain criteria are met in the layout.

In some embodiments, control of the placement of cut 218 by design rules associated with layout 200 includes controlling a distance of cut 218 from via connection 216. For integrated circuit performance, it is optimal to have cut 218 as close as possible to via connection 216 to minimize capacitance in active section 210A. Design rules for layout 200 may, however, define an allowable distance between the placement of cut 218 and via connection 216 (e.g., a minimum allowable distance between the cut and the via connection). Cut 218 is then placed as close as possible to via connection 216 as allowed by the design rules for layout 200.

Additional cuts 214 (shown in FIG. 2) and additional cut 218 (shown in FIG. 4) may be used individually (e.g., alone) or in combination to improve the performance of the integrated circuit of layout 200 by reducing capacitance in the integrated circuit. While FIGS. 1-4 depict embodiments of a single metal layer in integrated circuit layout 200, it would readily be understood by one skilled in the art that additional metal layers in the layout may also include cuts 214 and cut 218 (or similar cuts that electrically isolate portions of inactive sections). It would also be readily understood that layout 200 may have additional metal layers without additional cuts.

In certain embodiments, one or more of the integrated circuit layouts described herein may be designed and/or implement using one or more processors (e.g., a computer processor) executing instructions stored on a non-transitory computer-readable medium. For example, layout 200, shown in FIGS. 1-4, may be designed and/or implemented using one or more steps performed by one or more processors executing instructions stored as program instructions in a computer readable storage medium (e.g., a non-transitory computer readable storage medium).

Various portions of layout 200, shown in FIGS. 1-4, may be designed and/or implemented by various electronic design automation (EDA) tools or computer aided design (CAD) tools. Examples of such EDA or CAD tools include Synopsys' Design Compiler® or Cadence's Encounter® RTL Compiler, Synopsis' IC Compiler, and others. These EDA or CAD tools may include one or more modules of computer program instructions that, when executed by a computer processor, cause the processor to generate an integrated circuit layout such as layout 200 and, more specifically, generate one or more files for use in fabrication of the integrated circuit.

Figure 5:
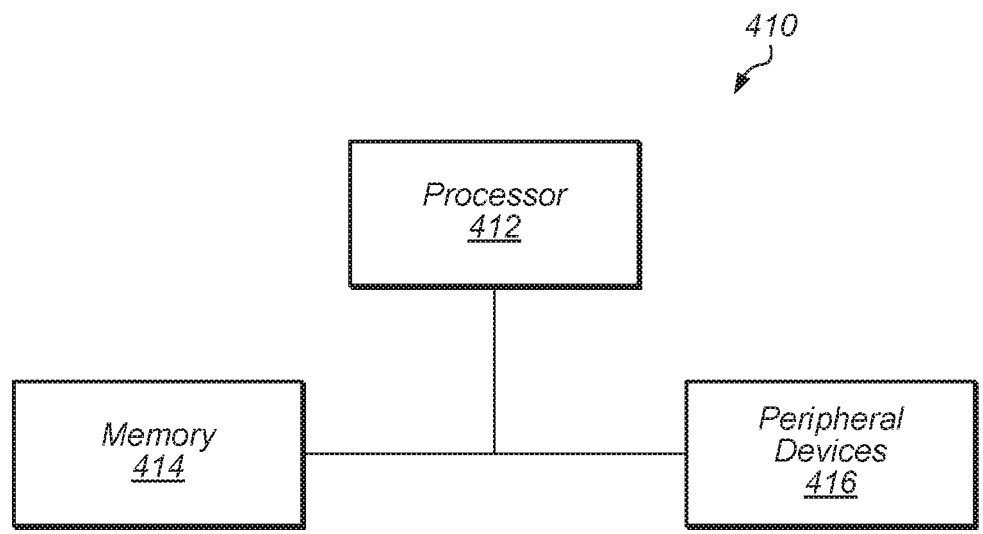
FIG. 5 depicts a block diagram of one embodiment of an exemplary computer system.

FIG. 5 depicts a block diagram of one embodiment of exemplary computer system 410. Exemplary computer system 410 may be used to implement one or more embodiments described herein. In some embodiments, computer system 410 is operable by a user to implement one or more embodiments described herein such as layout 200, shown in FIGS. 1-4. In the embodiment of FIG. 5, computer system 410 includes processor 412, memory 414, and various peripheral devices 416. Processor 412 is coupled to memory 414 and peripheral devices 416. Processor 412 is configured to execute instructions, including the instructions for process 200, which may be in software. In various embodiments, processor 412 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, computer system 410 may include more than one processor. Moreover, processor 412 may include one or more processors or one or more processor cores.

Processor 412 may be coupled to memory 414 and peripheral devices 416 in any desired fashion. For example, in some embodiments, processor 412 may be coupled to memory 414 and/or peripheral devices 416 via various interconnect. Alternatively or in addition, one or more bridge chips may be used to coupled processor 412, memory 414, and peripheral devices 416.

Memory 414 may comprise any type of memory system. For example, memory 414 may comprise DRAM, and more particularly double data rate (DDR) SDRAM, RDRAM, etc. A memory controller may be included to interface to memory 414, and/or processor 412 may include a memory controller. Memory 414 may store the instructions to be executed by processor 412 during use, data to be operated upon by the processor during use, etc.

Figure 6:
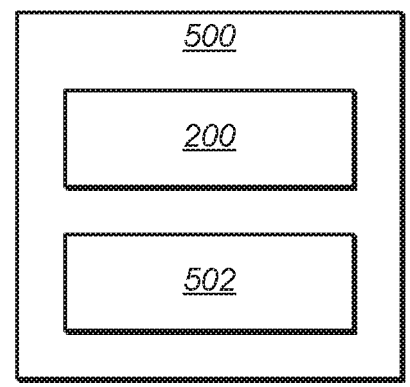
FIG. 6 depicts a block diagram of one embodiment of a computer accessible storage medium.

Peripheral devices 416 may represent any sort of hardware devices that may be included in computer system 410 or coupled thereto (e.g., storage devices, optionally including computer accessible storage medium 500, shown in FIG. 6, other input/output (I/O) devices such as video hardware, audio hardware, user interface devices, networking hardware, etc.).

Turning now to FIG. 6, a block diagram of one embodiment of computer accessible storage medium 500 including one or more data structures representative of layout 200 or components (e.g., tracks 208, cuts 212, 214, 218, via connections 216, etc.) in layout 200 (depicted in FIGS. 1-4) included in an integrated circuit design and one or more code sequences 502 representative of a process to form layout 200. Each code sequence may include one or more instructions, which when executed by a processor in a computer, implement the operations described for the corresponding code sequence. Generally speaking, a computer accessible storage medium may include any storage media accessible by a computer during use to provide instructions and/or data to the computer. For example, a computer accessible storage medium may include non-transitory storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, computer accessible storage medium 500 may store data in a non-transitory manner, where non-transitory in this context may refer to not transmitting the instructions/data on a signal. For example, non-transitory storage may be volatile (and may lose the stored instructions/data in response to a power down) or non-volatile.

Generally, the database of the layout 200 carried on the computer accessible storage medium 500 may be a database which can be read by a program and used, directly or indirectly, to fabricate the hardware comprising the layout 200. For example, the database may be a behavioral-level description or register-transfer level (RTL) description of the hardware functionality in a high level design language (HDL) such as Verilog or VHDL. The description may be read by a synthesis tool which may synthesize the description to produce a netlist of an integrated circuit for use in integrated circuit layout generation. The netlist may then be placed and routed to produce a data set describing geometric shapes to be applied to masks. The masks may then be used in various semiconductor fabrication steps to produce a semiconductor circuit or circuits corresponding to the layout 200. Alternatively, the database on the computer accessible storage medium 500 may be the netlist (with or without a synthesis library) or the data set, as desired.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed:

1. An integrated circuit layout, comprising:
    a standard cell;
    a metal layer in the standard cell, the metal layer comprising a plurality of substantially parallel metal tracks placed in the standard cell, wherein the metal tracks extend a width of the standard cell;
    one or more active sections defined in the metal tracks;
    one or more inactive sections defined in the metal tracks, wherein the inactive sections of the metal tracks are defined as sections of the metal tracks outside of the active sections; and
    at least one cut placed in at least one inactive region on at least one metal track, wherein the at least one cut is placed to electrically isolate a portion of the at least one metal track in the at least one inactive region from an adjacent portion of the at least one metal track.

2. The integrated circuit layout of claim 1, wherein the metal tracks extend from a first side of the standard cell to a second side of the standard cell, the first side being opposite the second side.

3. The integrated circuit layout of claim 1, wherein the active sections are defined by a plurality of cuts placed on the metal tracks.

4. The integrated circuit layout of claim 1, wherein at least one active section on at least one metal track is defined by cuts placed on each end of the at least one active section.

5. The integrated circuit layout of claim 4, wherein at least one inactive section on the at least one metal track comprises a section of the at least one metal track on the other side of the cut placed on an end of the at least one active section.

6. The integrated circuit layout of claim 1, wherein the active sections are defined by a plurality of connections placed on the metal tracks.

7. The integrated circuit layout of claim 6, wherein at least one connection comprises a connection to another layer in the standard cell.

8. The integrated circuit layout of claim 1, wherein at least one active section on at least one metal track is defined by connections placed on each end of the at least one active section.

9. The integrated circuit layout of claim 8, wherein at least one inactive section on the at least one metal track comprises a section of the at least one metal track on the other side of the connection placed on an end of the at least one active section.

10. The integrated circuit layout of claim 1, wherein the at least one cut placed in the at least one inactive region on the at least one metal track is placed as close to an adjacent active region of the at least one metal track as allowed by design rules for the standard cell.

11. The integrated circuit layout of claim 1, wherein the at least one cut placed in the at least one inactive region on the at least one metal track is placed at a boundary of the standard cell.

12. A computer implemented method, comprising:
    placing, by a place-and-route tool, executed using a computer processor, in dependence upon a netlist for an integrated circuit, a standard cell in a layout of the integrated circuit, wherein placing the standard cell comprises:
        placing a metal layer in the layout, the metal layer comprising a plurality of substantially parallel metal tracks placed in the standard cell, wherein the metal tracks extend a width of the standard cell;
        defining one or more active sections in the metal tracks;
        defining one or more inactive sections in the metal tracks, wherein the inactive sections of the metal tracks are defined as sections of the metal tracks outside of the active sections; and
        placing at least one cut in at least one inactive region on at least one metal track, wherein the at least one cut is placed to electrically isolate a portion of the at least one metal track in the at least one inactive region from an adjacent portion of the at least one metal track.

13. The computer implemented method of claim 12, wherein the metal tracks extend from a first side of the standard cell to a second side of the standard cell, the first side being opposite the second side.

14. The computer implemented method of claim 12, further comprising placing an additional cut on each end of at least one active section on at least one metal track to define the at least one active section.

15. The computer implemented method of claim 12, further comprising placing a connection on each end of at least one active section on at least one metal track to define the at least one active section.

16. The computer implemented method of claim 15, wherein the connection on at least one end of the at least one active section comprises a connection to another layer in the standard cell.

17. The computer implemented method of claim 12, further comprising generating, by the place-and-route tool based on the integrated circuit layout, one or more computer instructions for use in integrated circuit fabrication.

18. A non-transitory computer readable storage medium storing a plurality of instructions which, when executed, generate an integrated circuit layout that comprises:
    a standard cell;
    a metal layer in the standard cell, the metal layer comprising a plurality of substantially parallel metal tracks placed in the standard cell, wherein the metal tracks extend a width of the standard cell;
    one or more active sections defined in the metal tracks;
    one or more inactive sections defined in the metal tracks, wherein the inactive sections of the metal tracks are defined as sections of the metal tracks outside of the active sections; and
    at least one cut placed in at least one inactive region on at least one metal track, wherein the at least one cut is placed to electrically isolate a portion of the at least one metal track in the at least one inactive region from an adjacent portion of the at least one metal track.

19. The non-transitory computer readable storage medium of claim 18, wherein the plurality of instructions comprises design rules for the standard cell that define an allowable distance between the at least one cut and an adjacent active region of the at least one metal track for placement of the at least one cut.

20. The non-transitory computer readable storage medium of claim 18, wherein the plurality of instructions comprises design rules for the standard cell that place the at least one cut placed at a boundary of the standard cell.

* * * * *